United States Patent
Tang et al.

(10) Patent No.: US 12,260,906 B2
(45) Date of Patent: Mar. 25, 2025

(54) HARDWARE/SOFTWARE CO-COMPRESSED COMPUTING METHOD AND SYSTEM FOR STATIC RANDOM ACCESS MEMORY COMPUTING-IN-MEMORY-BASED PROCESSING UNIT

(71) Applicant: NATIONAL TSING HUA UNIVERSITY, Hsinchu (TW)

(72) Inventors: Kea-Tiong Tang, Taipei (TW);
Syuan-Hao Sie, New Taipei (TW);
Jye-Luen Lee, Taipei (TW)

(73) Assignee: NATIONAL TSING HUA UNIVERSITY, Hsinchu (TW)

(*) Notice: Subject to any disclaimer, the term of this patent is extended or adjusted under 35 U.S.C. 154(b) by 874 days.

(21) Appl. No.: 17/446,832

(22) Filed: Sep. 3, 2021

(65) Prior Publication Data
US 2022/0366971 A1 Nov. 17, 2022

(30) Foreign Application Priority Data
May 4, 2021 (TW) ................. 110116064

(51) Int. Cl.
*G06F 17/16* (2006.01)
*G06F 18/2134* (2023.01)
(Continued)

(52) U.S. Cl.
CPC ........ *G11C 11/54* (2013.01); *G06F 18/21345* (2023.01); *G06N 3/08* (2013.01); *G11C 11/4087* (2013.01); *G06F 18/21326* (2023.01)

(58) Field of Classification Search
CPC ................. G11C 11/54; G11C 11/4087; G06F 18/21345; G06F 18/21326; G06N 3/08
See application file for complete search history.

(56) References Cited

U.S. PATENT DOCUMENTS 6,587,914 B2 * 7/2003 Campardo .............. G06F 9/262
712/E9.011
10,901,815 B2 * 1/2021 Chen .................... G06N 3/063
(Continued)

FOREIGN PATENT DOCUMENTS

CA 3060350 A1 * 10/2018 ............... B60R 1/00
CA 3090329 C * 7/2021 ......... G06F 13/4282
(Continued)

OTHER PUBLICATIONS

Syuan-Hao Sie et al., "MARS: Multi-macro Architecture SRAM CIM-Based Accelerator with Co-designed Compressed Neural Networks", the earliest submission date on Oct. 24, 2020, e-print, accessed at https://arxiv.org/ftp/arxiv/papers/2010/2010.12861.pdf, United States.

*Primary Examiner* — Cheng Yuan Tseng
(74) *Attorney, Agent, or Firm* — CKC & Partners Co., LLC

(57) ABSTRACT

A hardware/software co-compressed computing method for a static random access memory (SRAM) computing-in-memory-based (CIM-based) processing unit includes performing a data dividing step, a sparsity step, an address assigning step and a hardware decoding and calculating step. The data dividing step is performed to divide a plurality of kernels into a plurality of weight groups. The sparsity step includes performing a weight setting step. The weight setting step is performed to set each of the weight groups to one of a zero weight group and a non-zero weight group. The address assigning step is performed to assign a plurality of index codes to a plurality of the non-zero weight groups, respectively. The hardware decoding and calculating step is performed to execute an inner product to the non-zero weight groups and the input feature data group correspond-
(Continued)

ing to the non-zero weight groups to generate the output feature data group.

10 Claims, 8 Drawing Sheets

(51) Int. Cl.
*G06N 3/08* (2023.01)
*G11C 11/408* (2006.01)
*G11C 11/54* (2006.01)
G06F 18/2132 (2023.01)

(56) References Cited

U.S. PATENT DOCUMENTS

| | | | |
|---|---|---|---|
| 11,580,369 B2 * | 2/2023 | Shibata | G06N 3/063 |
| 11,610,099 B2 * | 3/2023 | Martin | G06N 3/063 |
| 11,669,446 B2 * | 6/2023 | Verma | G06N 3/063 |
| | | | 711/157 |
| 11,928,578 B2 * | 3/2024 | Ryu | G06F 17/16 |
| 2019/0205358 A1 * | 7/2019 | Diril | G06N 3/063 |
| 2022/0317973 A1 * | 10/2022 | Shin | G06N 3/04 |
| 2023/0074229 A1 * | 3/2023 | Jia | G06F 15/7821 |

FOREIGN PATENT DOCUMENTS

| | | | | |
|---|---|---|---|---|
| CN | 106529670 A | | 3/2017 | |
| CN | 108932548 A | * | 12/2018 | G06N 3/082 |
| CN | 109389218 A | * | 2/2019 | G06F 1/3296 |
| CN | 116261736 A | * | 6/2023 | G06F 9/30036 |
| JP | 7587823 B2 | * | 11/2024 | G06F 12/0207 |
| WO | WO-2019162738 A1 | * | 8/2019 | G06F 12/0284 |

* cited by examiner

HARDWARE/SOFTWARE CO-COMPRESSED COMPUTING METHOD AND SYSTEM FOR STATIC RANDOM ACCESS MEMORY COMPUTING-IN-MEMORY-BASED PROCESSING UNIT

RELATED APPLICATIONS

This application claims priority to Taiwan Application Serial Number 110116064, filed May 4, 2021, which is herein incorporated by reference.

BACKGROUND

Technical Field

The present disclosure relates to a hardware/software co-compressed computing method and system. More particularly, the present disclosure relates to a hardware/software co-compressed computing method and system for a static random access memory computing-in-memory-based processing unit.

Description of Related Art

A computing-in-memory-based (CIM-based) processing unit can compute the data without transmitting the data to a processing unit. Computing the data in the memory can reduce the time and energy of transmitting the data. Thus, the CIM-based processing unit exhibits low energy consumption and high operation speed. However, the computing amount in a single time is limited by the limitation of the capacity of a static random access memory (SRAM) CIM-based processing unit, the data needs to be computed in batches, and the computing time will be increased.

Except for expanding the number of the SRAM CIM-based processing unit to increase the meaningful computing amount in a single time, thereby simplifying the computing data and reducing the computing time. Thus, a hardware/software co-compressed computing method and system for the SRAM CIM-based processing unit are commercially desirable.

SUMMARY

According to one aspect of the present disclosure, a hardware/software co-compressed computing method for a static random access memory (SRAM) computing-in-memory-based (CIM-based) processing unit is configured to compute an input feature data group to generate an output feature data group. The hardware/software co-compressed computing method for the SRAM CIM-based processing unit includes performing a data dividing step, a sparsity step, an address assigning step and a hardware decoding and calculating step. The data dividing step is performed to drive a processing unit to divide a plurality of kernels corresponding to the input feature data group into a plurality of weight groups. The sparsity step includes performing a weight setting step. The weight setting step is performed to drive the processing unit to set each of the weight groups to one of a zero weight group and a non-zero weight group according to a sparsity aware computing method. The address assigning step is performed to drive the computing device to assign a plurality of index codes to a plurality of the non-zero weight groups of the kernels, respectively, and transmit the non-zero weight groups to the SRAM CIM-based processing unit. The hardware decoding and calculating step is performed to drive the SRAM CIM-based processing unit to execute an inner product to the non-zero weight groups and the input feature data group corresponding to the non-zero weight groups to generate the output feature data group. The index codes corresponding to the non-zero weight groups of one of the kernels are the same as the index codes corresponding to the non-zero weight groups of another one of the kernels, respectively.

According to another aspect of the present disclosure, a hardware/software co-compressed computing system for a SRAM CIM-based processing unit is configured to compute an input feature data group to generate an output feature data group. The hardware/software co-compressed computing system for the SRAM CIM-based processing unit includes a processing unit and a computing device. The processing unit is configured to divide a plurality of kernels corresponding to the input feature data group into a plurality of weight groups, set each of the weight groups to one of a zero weight group and a non-zero weight group according to a sparsity aware computing method, and assign a plurality of index codes to a plurality of the non-zero weight groups of the kernels. The computing device is electrically connected to the processing unit. The computing unit receives the input feature data group, the non-zero weight groups and the index codes corresponding to the non-zero weight groups, and the computing device includes an input data access memory, a sparsity processing module and the SRAM CIM-based processing unit. The input data access memory is configured to access the input feature data group. The sparsity processing module is signally connected to the input data access memory, and includes an index access memory and an address computing unit. The index access memory is configured to access the index codes. The address computing unit is signally connected to the index access memory, the address computing unit computes an input data address of the input feature data group corresponding to the non-zero weight groups according to the index codes. The SRAM CIM-based processing unit is signally connected to the input data access memory, the SRAM CIM-based processing unit receives the non-zero weight group and the input feature data group to execute an inner product and generates the output feature data group. The index codes corresponding to the non-zero weight groups of one of the kernels are the same as the index codes corresponding to the non-zero weight groups of another one of the kernels, respectively.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
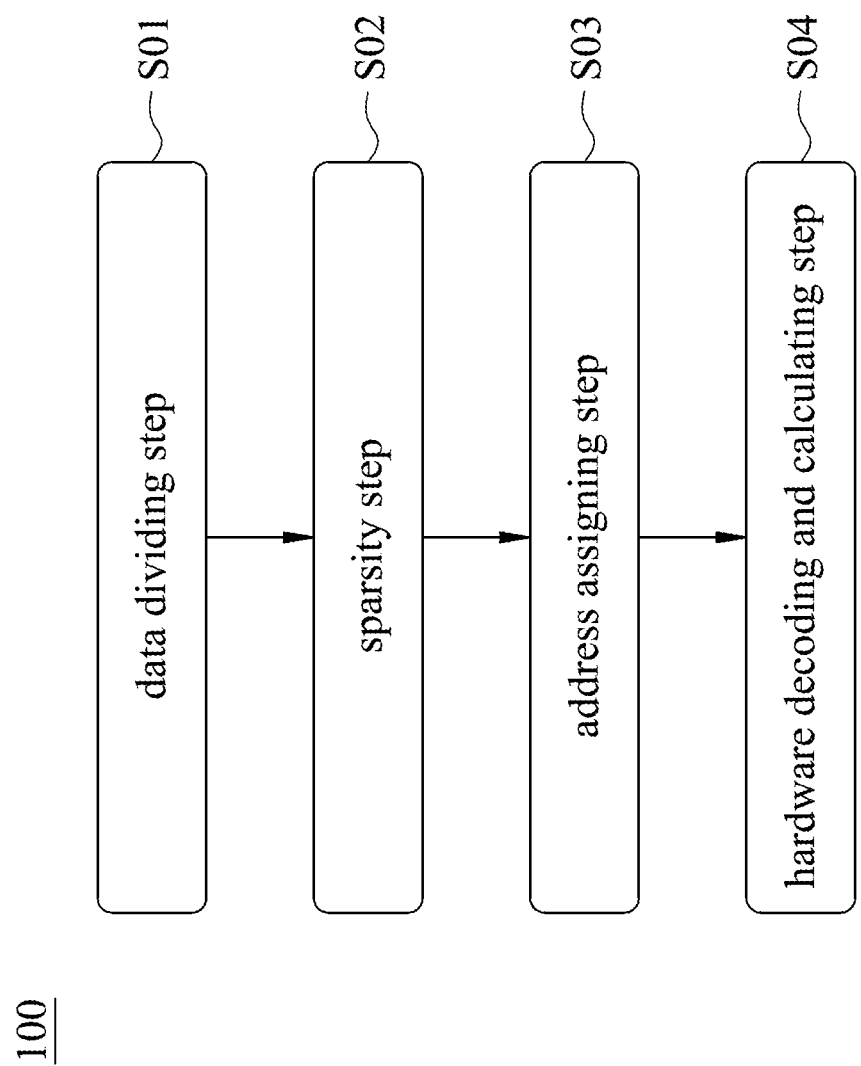
FIG. 1 shows a flow chart of a hardware/software co-compressed computing method for a static random access memory (SRAM) computing-in-memory-based (CIM-based) processing unit according to a first embodiment of the present disclosure.

Please refer to FIG. 1. FIG. 1 shows a flow chart of a hardware/software co-compressed computing method 100 for a static random access memory (SRAM) computing-in-memory-based (CIM-based) processing unit according to a first embodiment of the present disclosure. The hardware/software co-compressed computing method 100 for the SRAM CIM-based processing unit is configured to compute an input feature data group to generate an output feature data group. The hardware/software co-compressed computing method 100 for the SRAM CIM-based processing unit includes performing a data dividing step S01, a sparsity step S02, an address assigning step S03 and a hardware decoding and calculating step S04. The data dividing step S01 is performed to drive a processing unit to divide a plurality of kernels corresponding to the input feature data group into a plurality of weight groups. The sparsity step S02 includes driving the processing unit to set each of the weight groups to one of a zero weight group and a non-zero weight group according to a sparsity aware computing method. The address assigning step S03 is performed to drive the computing device to assign a plurality of index codes to a plurality of the non-zero weight groups of the kernels, respectively, and transmit the non-zero weight groups to the SRAM CIM-based processing unit. The hardware decoding and calculating step S04 is performed to drive the SRAM CIM-based processing unit to execute an inner product to the non-zero weight groups and the input feature data group corresponding to the non-zero weight groups to generate the output feature data group. The index codes corresponding to the non-zero weight groups of one of the kernels are the same as the index codes corresponding to the non-zero weight groups of another one of the kernels, respectively. Thus, the hardware/software co-compressed computing method 100 for the SRAM CIM-based processing unit of the present disclosure only computes a part of input feature data group which is corresponding to the non-zero weight groups, to solve the problem of the limitation of the single computing amount of the SRAM CIM-based processing unit, thereby reducing the energy loss and increasing the computing speed. Each of the steps of the hardware/software co-compressed computing method 100 for the SRAM CIM-based processing unit is described in more detail below.

Figure 2:
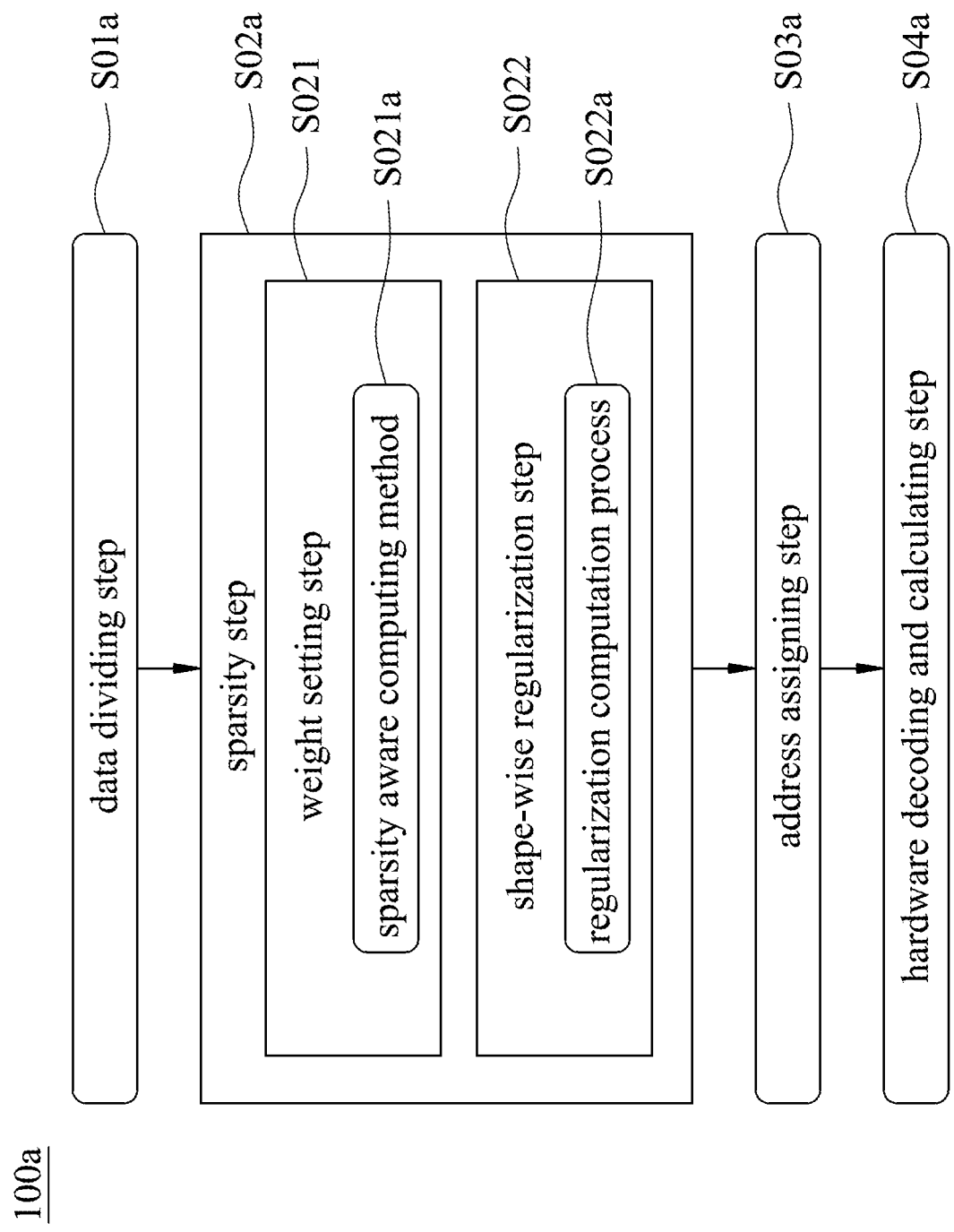
FIG. 2 shows a flow chart of a hardware/software co-compressed computing method for a SRAM CIM-based processing unit according to a second embodiment of the present disclosure.

Please refer to FIG. 2. FIG. 2 shows a flow chart of a hardware/software co-compressed computing method 100a for a SRAM CIM-based processing unit according to a second embodiment of the present disclosure. The hardware/software co-compressed computing method 100a for the SRAM CIM-based processing unit is configured to compute an input feature data group to generate an output feature data group. The hardware/software co-compressed computing method 100a for the SRAM CIM-based processing unit includes performing a data dividing step S01a, a sparsity step S02a, an address assigning step S03a and a hardware decoding and calculating step S04a.

Figure 3:
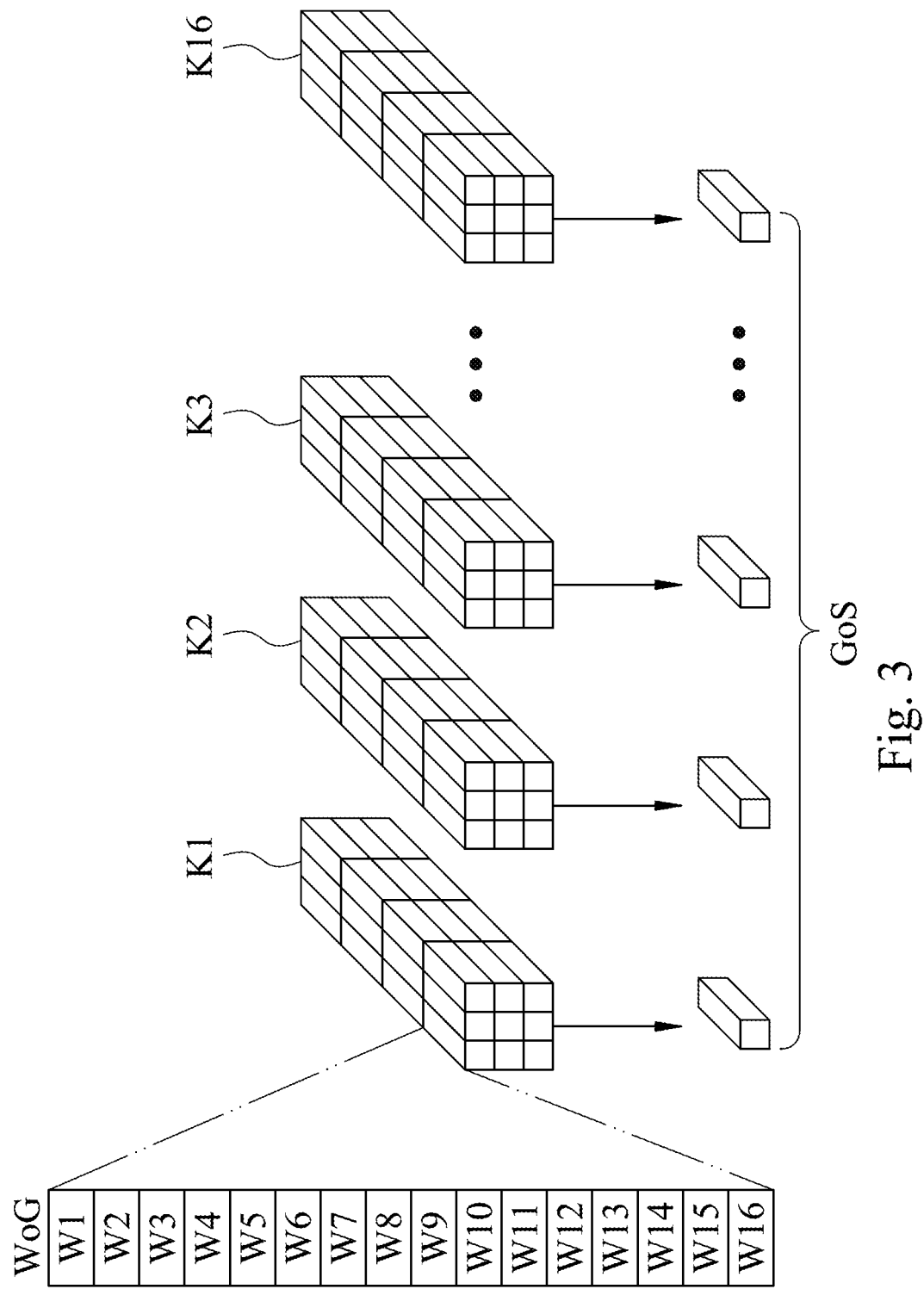
FIG. 3 shows a schematic view of a data dividing step of the hardware/software co-compressed computing method for the SRAM CIM-based processing unit of FIG. 2.

Please refer to FIG. 3. FIG. 3 shows a schematic view of the data dividing step S01a of the hardware/software co-compressed computing method 100a for the SRAM CIM-based processing unit of FIG. 2. The data dividing step S01a is performed to drive a processing unit to divide a plurality of kernels K1, K2, K3-K16 corresponding to the input feature data group into a plurality of weight groups WoG. In detail, an input feature data group is corresponding to a plurality of weights, and the data dividing step S01a divides each of the kernels K1-K16 into the weight groups WoG, respectively. Each of the kernels K1-K16 includes the weight groups WoG, and each of the weight groups WoG includes a plurality of weight values W1, W2, W3, W4, W5, W6, W7, W8, W9, W10, W11, W12, W13, W14, W15 and W16. One of the weight groups WoG corresponding to a same position in each of the kernels K1-K16 is defined as one part of a group of set GoS. In the aforementioned embodiment, the group of set GoS (such as a first weight group WoG of each of the kernels K1-K16) is corresponding to a same part of the input feature data group. Each of the kernels K1-K16 includes 36 weight groups WoG, each of the weight groups WoG includes 16 weight values W1-W16, and the group of set GoS includes 16 weight groups WoG, but the present disclosure is not limited thereto.

The sparsity step S02a includes performing a weight setting step S021 and a shape-wise regularization step S022. The weight setting step S021 is performed to drive the processing unit to set each of the weight groups WoG to one of a zero weight group and a non-zero weight group according to a sparsity aware computing method S021a. The sparsity aware computing method S021a includes a regularization term $$\frac{\lambda}{2} R(w),$$

and the regularization term $$\frac{\lambda}{2} R(w)$$

is configured to restrict the weight values W1-W16 of the weight groups WoG. The weight setting step S021 includes in response to determining that a sum of the weight values W1-W16 of one of the weight groups WoG is greater than a self-defined value, the one of the weight groups WoG is set to the non-zero weight group, and in response to determining that the sum of the weight values W1-W16 of the one of the weight groups WoG is smaller than or equal to the self-defined value, the one of the weight groups WoG is set to the zero weight group. Furthermore, the weight setting step S021 determines whether a piece of data is an important data to be computed or an unimportant data to be omitted by the self-defined value. If the sum of the weight values W1-W16 of the one of the weight groups WoG is smaller than the self-defined value, the piece of data can be viewed as an unimportant data. The sparsity aware computing method S021a trains the one of the weight groups WoG to let all the weight values W1-W16 approach zero until all the weight values W1-W16 of the one of the weight groups WoG are all zero, and then sets the one of the weight groups WoG to a zero weight group. The sparsity aware computing method S021a is satisfied by a formula (1).

$$E(w) = L(w) + \frac{\lambda}{2} R(w) + \frac{\lambda_g}{2} \sum_{l=1}^{L} R_g(W^{(l)}). \quad (1)$$

E(w) represents the sparsity aware computing method S021a, L(w) represents a loss function, and $\lambda$ and $\lambda_g$ represent hyperparameters. W represents the weight value, l represents a current computing layer, and $R_g(W^{(l)})$ represents the regularization computation process S022a. Loss function L(w) is configured to train the weight groups WoG, to let the weight values W1-W16 approaching zero. The hyperparameters $\lambda$ and $\lambda_g$ are configured to adjust an accuracy of the co-compressed processing. The shape-wise regularization step S022 is performed to execute the regularization computation process S022a to the kernels K1-K16 according to an area information of the weight groups WoG, and adjust a group sequence number corresponding to the non-zero weight group to be the same as the group sequence number corresponding to the non-zero weight group of the one of the kernels K1-K16. In the present embodiment, the weight values W1-W16 of the weight group WoG after executed by the weight setting step S021 are listed in Table 1. Table 1 lists the weight values W1-W16 corresponding to 36 weight groups of the first kernel K1, and the group sequence numbers of the 36 weight groups WoG are represented by G1-G36. The group sequence numbers G1, G4, G10 and G36 of the weight groups WoG are non-zero weight groups, the weight values W1-W16 of the other weight groups WoG (i.e., the group sequence numbers G2, G3, G5-G9, G11-G35) are approaching zero, and become zero weight groups.

TABLE 1

| group sequence numbers of weight groups WoG | weight values W1-W16 |
|---|---|
| G1 (non-zero weight group) | 0123456789abcdef |
| G2 (zero weight group) | 0000000000000000 |
| G3 (zero weight group) | 0000000000000000 |
| G4 (non-zero weight group) | 02468ace13579bdf |
| G5-G9 (zero weight group) | 0000000000000000 |
| G10 (non-zero weight group) | 13579bdf00000000 |
| G11-G35 (zero weight group) | 0000000000000000 |
| G36 (non-zero weight group) | fedcba987654321 |

Figure 4:
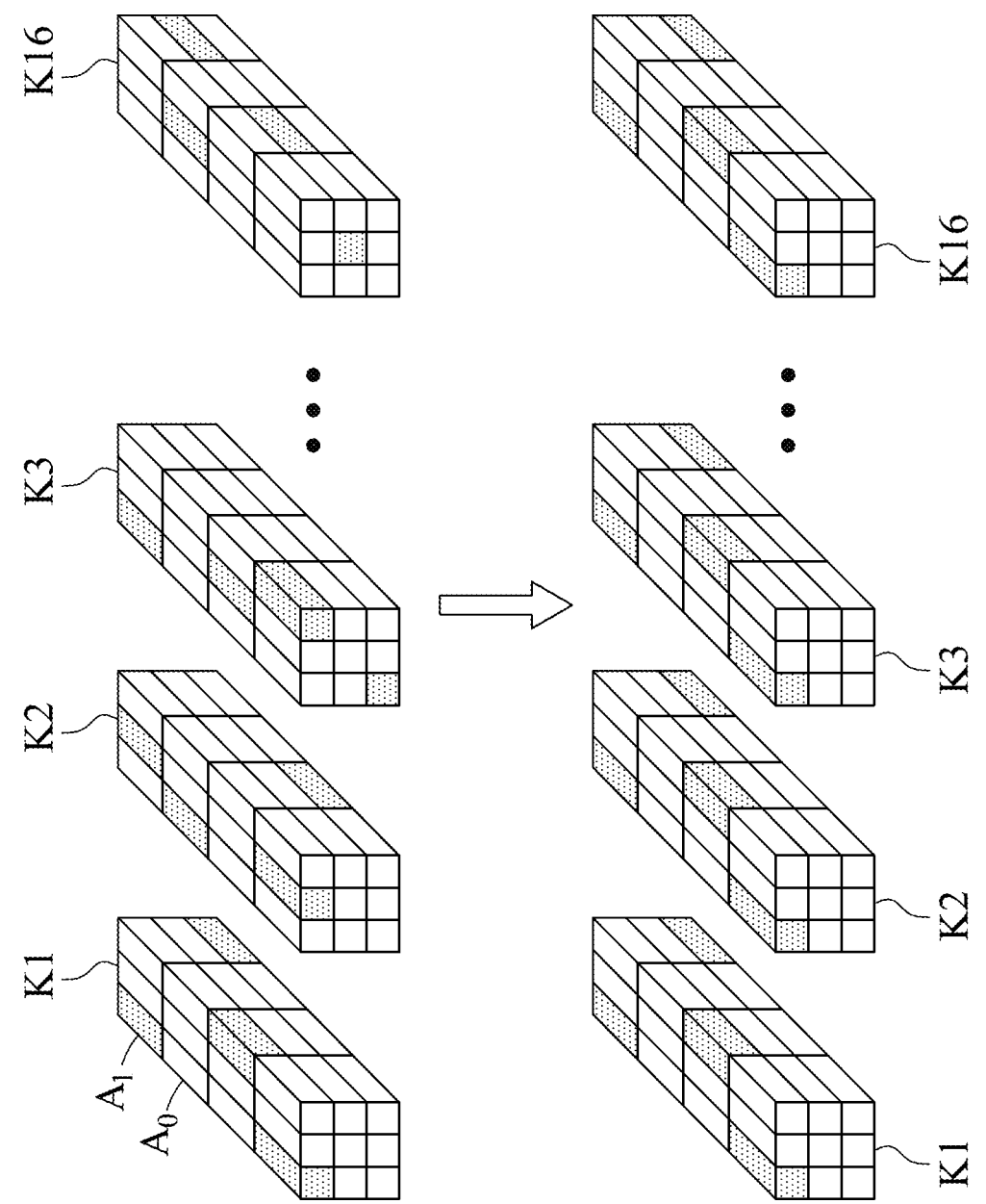
FIG. 4 shows a schematic view of a shape-wise regularization step of the hardware/software co-compressed computing method for the SRAM CIM-based processing unit of FIG. 2.
Figure 5:
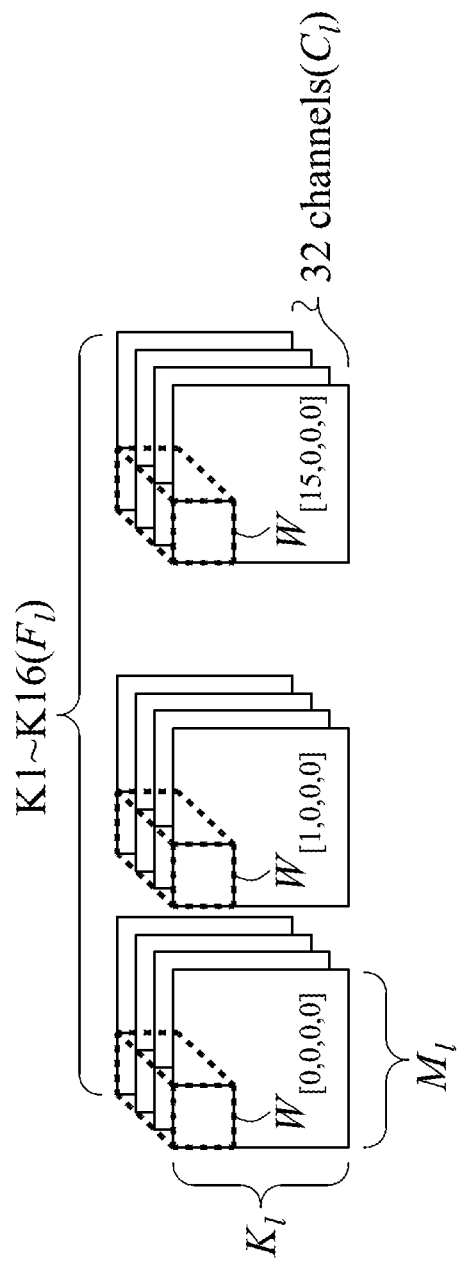
FIG. 5 shows a schematic view of a regularization computation process of the shape-wise regularization step of the hardware/software co-compressed computing method for the SRAM CIM-based processing unit of FIG. 2.

Please refer to FIG. 4 and FIG. 5. FIG. 4 shows a schematic view of the shape-wise regularization step S022 of the hardware/software co-compressed computing method 100a for the SRAM CIM-based processing unit of FIG. 2. FIG. 5 shows a schematic view of the regularization computation process S022a of the shape-wise regularization step S022 of the hardware/software co-compressed computing method 100a for the SRAM CIM-based processing unit of FIG. 2. The shape-wise regularization step S022 is performed to execute a regularization computation process S022a to the kernels K1-K16 according to an area information of the weight groups WoG, and adjust a group sequence number corresponding to the non-zero weight group $A_1$ to be the same as the group sequence number corresponding to the non-zero weight group $A_1$ of the one of the kernels K1-K16. The area information includes a kernel width $M_l$, a kernel height $K_l$, a channel depth $C_l$, a kernel number $F_l$, an input data amount and an output data amount. In detail, the kernels K1-K16 after executed by the shape-wise regularization step S022 are shown in FIG. 4, the non-zero weight groups $A_1$ of each of the kernels K1-K16 are distributed in the same group sequence number, the zero weight groups $A_0$ of each of the kernels K1-K16 are distributed in the same group sequence number. The regularization computation process S022a is satisfied by a formula (2):

$$R_g(W^l) = \sum_{m_l=0}^{M_l} \sum_{k_l=0}^{K_l} \sum_{c_l=0}^{C_l/N} \sum_{f_l=0}^{F_l/\alpha} \left\| W^{(l)}_{\alpha f_l: \alpha f_l + \alpha, Nc_l: Nc_l + N, m_l, k_l} \right\|_2. \quad (2)$$

N is an input data amount of the SRAM CIM-based processing unit, and a is an output amount of the SRAM CIM-based processing unit.

In the embodiment of FIG. 5, the kernel width $M_l$ is 3, the kernel height $K_l$ is 3, the channel depth $C_l$ is 32 channels, the kernel number $F_l$ is 16, the input data amount N is 16, and the output data amount a is 8. [0, 0, 0, 0] represents [$F_l$, $C_l$, $K_l$, $M_l$], and $W_{[0, 0, 0, 0]}$ represents a first weight value W1 of a first channel of the first kernel K1. $W_{[1, 0, 0, 0]}$ represents a first weight value W1 of a first channel of the second kernel K2. $W_{[15, 0, 0, 0]}$ represents a first weight value W1 of a first channel of the sixteenth kernel K16. The regularization computation process S022a is satisfied by a formula (3), a formula (4) and a formula (5).

$$R_g(W^l) = \sum_{m_l=0}^{2} \sum_{k_l=0}^{2} \sum_{c_l=0}^{32/16} \sum_{f_l=0}^{32/8} \left\| W^{(l)}_{8f_l:8f_l+8,16c_l:16c_l+16,m_l,k_l} \right\|_2. \quad (3)$$

$$R_g(W^l) = \left\| W^{(l)}_{0:8,0:16,0,0} \right\|_2 + \left\| W^{(l)}_{8:16,0:16,0,0} \right\|_2 + \ldots + \left\| W^{(l)}_{24:32,16:32,2,2} \right\|_2. \quad (4)$$

$$\left\| W^{(l)}_{0:8,0:16,0,0} \right\|_2 = \sqrt{\left( W^l_{[0,0,0,0]} \right)^2 + \ldots + \left( W^l_{[7,15,0,0]} \right)^2}. \quad (5)$$

Figure 6:
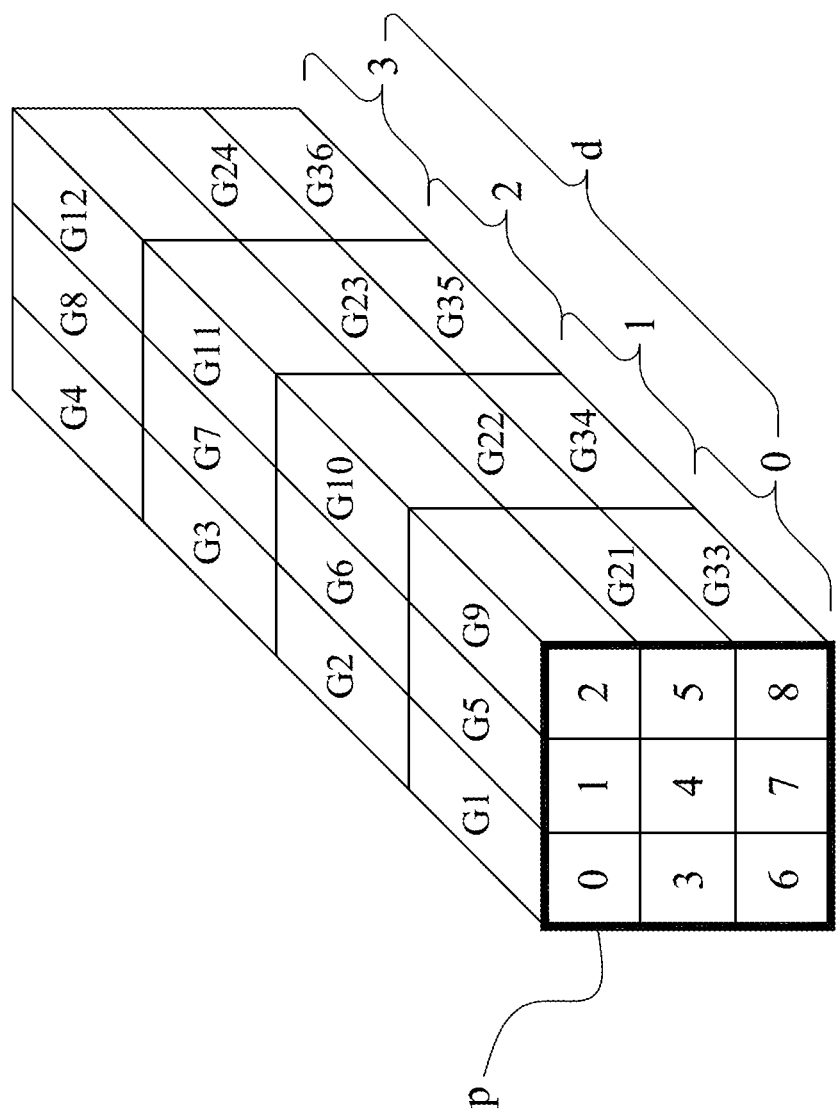
FIG. 6 shows a schematic view of an encoding operation of an index code of the hardware/software co-compressed computing method for the SRAM CIM-based processing unit of FIG. 2.

Please refer to FIG. 6. FIG. 6 shows a schematic view of an encoding operation of the index codes of the hardware/software co-compressed computing method 100a for the SRAM CIM-based processing unit of FIG. 2. The address assigning step S03a is performed to drive the computing device to assign a plurality of index codes to the non-zero weight groups $A_1$ of each of the kernels K1-K16, respectively. Each of the index codes includes a first group index, a non-zero weight group number, a kernel plane index p and a kernel depth index d. The index codes can be listed in Table 2. Furthermore, the index codes are configured to represent addresses of the non-zero weight group $A_1$ of the kernels K1-K16. The first group index is configured to represent whether the non-zero weight group $A_1$ is a weight group WoG with the group sequence number G1 of each of the kernels K1-K16. If the non-zero weight group $A_1$ is a weight group WoG with the group sequence number G1 of each of the kernels K1-K16, the first group index of the non-zero weight group $A_1$ is 1'b1; otherwise, if the non-zero weight group $A_1$ is not a weight group WoG with the group sequence number G1 of each of the kernels K1-K16, the first group index of the non-zero weight group $A_1$ is 1'b0. The non-zero weight group number represents a number of the non-zero weight groups $A_1$ of the weight groups of each of the kernels K1-K16. The kernel plane index p and the kernel depth index d are configured to represent each of the position of each of the non-zero weight group $A_1$ in each of the kernels K1-K16. In the present embodiment of FIG. 6, the non-zero weight groups $A_1$ of the first kernel K1 are weight groups WoG with the group sequence numbers G1, G4, G10, G36, the non-zero weight group number of the non-zero weight groups $A_1$ of the first kernel K1 is 4. The kernel plane index p of the weight group WoG with the group sequence number G1 of the first kernel K1 is 0, the kernel depth index d of the weight group WoG with the group sequence number G1 of the first kernel K1 is 0. The kernel plane index p of the weight group WoG with the group sequence number G4 of the first kernel K1 is 0, the kernel depth index d of the weight group WoG with the group sequence number G1 of the first kernel K1 is 3. The kernel plane index p of the weight group WoG with the group sequence number G10 of the first kernel K1 is 2, and the kernel depth index d of the weight group WoG with the group sequence number G10 of the first kernel K1 is 1. The kernel plane index p of the weight group WoG with the group sequence number G36 of the first kernel K1 is 5, and the kernel depth index d of the weight group WoG with the group sequence number G1 of the first kernel K1 is 0. The non-zero weight group number, the kernel plane index p and the kernel depth index d are represented in binary. In the present embodiment, the index code is represented in 16 bits, but the present disclosure is not limited thereto.

TABLE 2

| first group index | non-zero weight group number | kernel plane index p | kernel depth index d |
|---|---|---|---|
| 1'b1 | 6'b000011 | 4'b0000 | 5'b00000 |
| 1'b0 | 6'b000011 | 4'b0000 | 5'b00011 |
| 1'b0 | 6'b000011 | 4'b0010 | 5'b00001 |
| 1'b0 | 6'b000011 | 4'b0111 | 5'b00011 |

The hardware decoding and calculating step S04a is performed to drive the SRAM CIM-based processing unit to execute an inner product to the non-zero weight groups $A_1$ and the input feature data group corresponding to the non-zero weight groups $A_1$ to generate the output feature data group. The index codes corresponding to the non-zero weight groups $A_1$ of one of the kernels K1-K16 are the same as the index codes corresponding to the non-zero weight groups $A_1$ of another one of the kernels K1-K16, respectively. In other words, the hardware decoding and calculating step S04a is performed to transmit a part of the input feature data group which are corresponding to the index codes to the SRAM CIM-based processing unit according to the index codes corresponding to the non-zero weight groups $A_1$. Because the position of the non-zero weight group $A_1$ of each one of the kernels K1-K16 is located in the same position of another one of the kernels K1-K16, the hardware decoding and calculating step S04a executes the inner product to a part of the input feature data group corresponding to the non-zero weight groups $A_1$ and the non-zero weight groups $A_1$ of all the kernels K1-K16 by choosing the index codes of the non-zero weight groups $A_1$ of one of the kernels (such as kernel K1). Thus, the hardware/software co-compressed computing method 100a for the SRAM CIM-based processing unit of the present disclosure filters the input feature data group for skipping over the non-essential computing data, to solve the problem of the insufficient space of the SRAM CIM-based processing unit and increase the meaningful computing amount in a single time.

Figure 7:
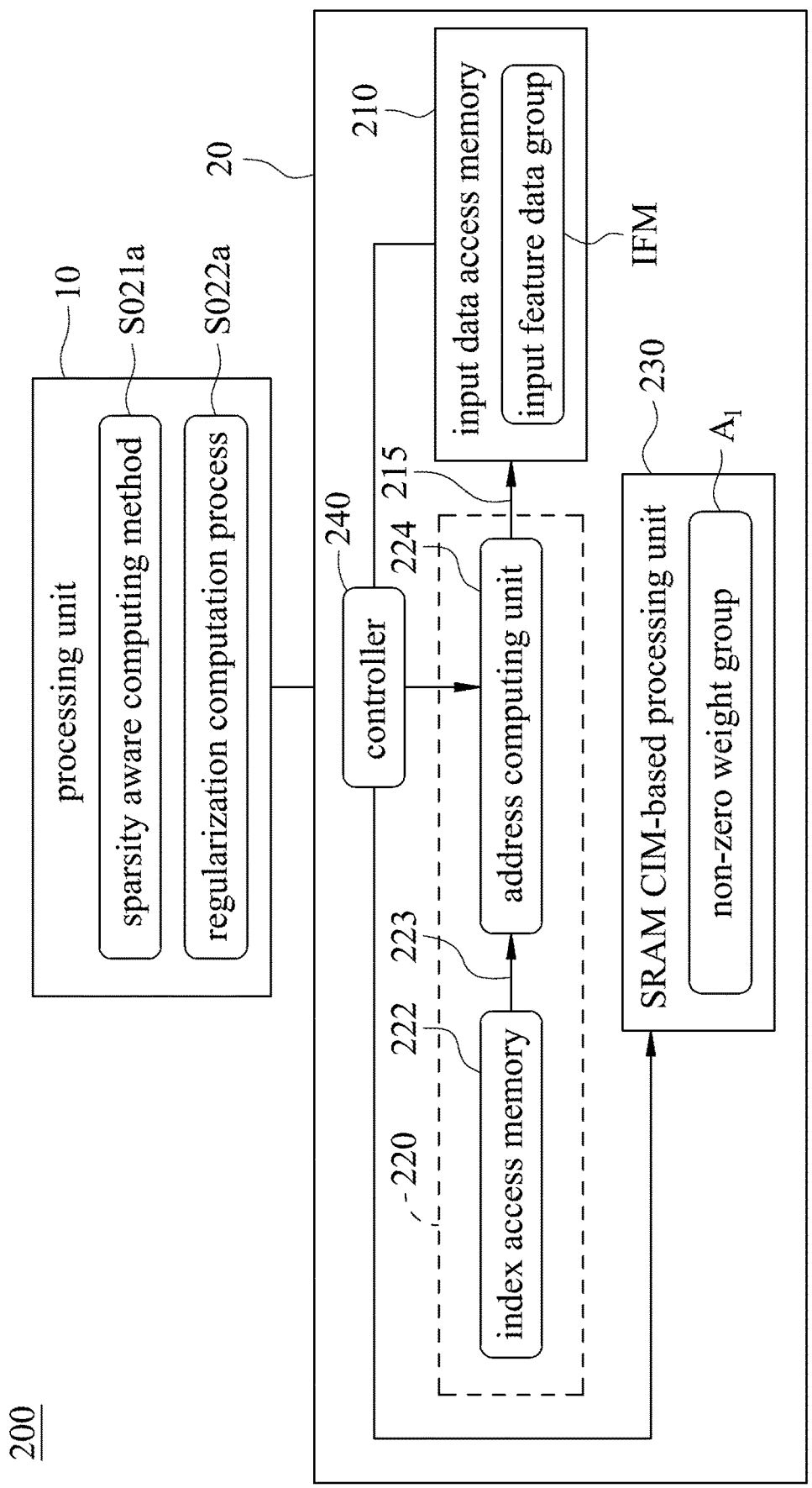
FIG. 7 shows a block diagram of a hardware/software co-compressed computing system for a SRAM CIM-based processing unit according to a third embodiment of the present disclosure.
Figure 8:
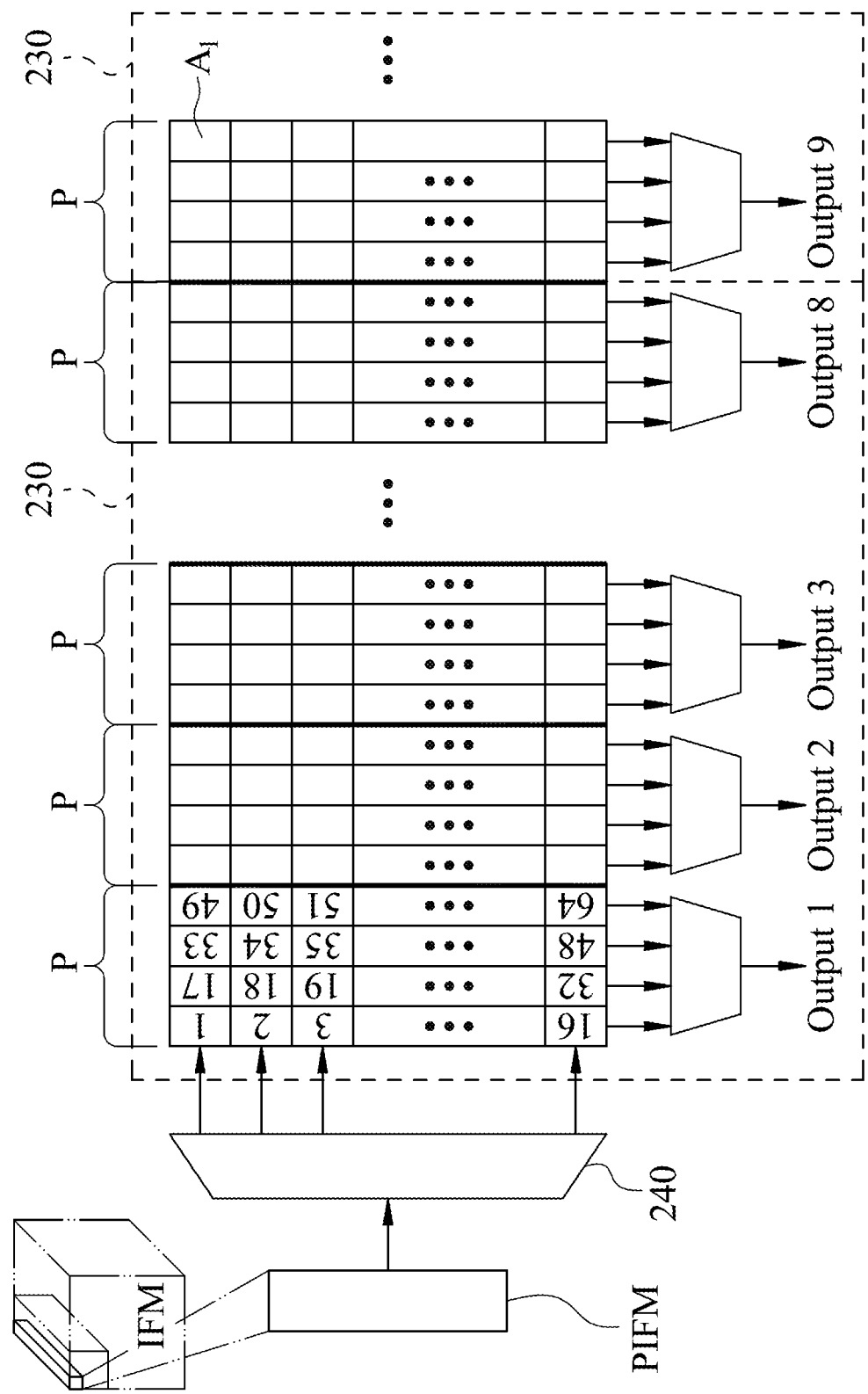
FIG. 8 shows a schematic view of the SRAM CIM-based processing unit of the hardware/software co-compressed computing system for the SRAM CIM-based processing unit of FIG. 7.

Please refer to FIG. 2, FIG. 7 and FIG. 8. FIG. 7 shows a block diagram of a hardware/software co-compressed computing system 200 for a SRAM CIM-based processing unit 230 according to a third embodiment of the present disclosure. FIG. 8 shows a schematic view of the SRAM CIM-based processing unit 230 of the hardware/software co-compressed computing system 200 for the SRAM CIM-based processing unit 230 of FIG. 7. The hardware/software co-compressed computing system 200 for the SRAM CIM-based processing unit 230 includes a processing unit 10 and a computing device 20. The processing unit 10 is configured to divide a plurality of kernels K1-K16 corresponding to the input feature data group IFM into a plurality of weight groups WoG, set each of the weight groups WoG to one of a zero weight group $A_0$ and a non-zero weight group $A_1$ according to a sparsity aware computing method S021a, and assign a plurality of index codes 223 to a plurality of the non-zero weight groups $A_1$ of the kernels K1-K16. The computing device 20 includes an input data access memory 210, a sparsity processing module 220 and the SRAM CIM-based processing unit 230. In detail, the processing unit 10 can be a microprocessor, a central processing unit (CPU) or other electrical computing device. The SRAM CIM-based processing unit 230 can be an artificial intelligence accelerator, the SRAM CIM-based processing unit 230 includes a partitions P, and each of the partitions P includes N×c non-zero weight groups $A_1$. The input data amount of the SRAM CIM-based processing unit 230 is N bits, the output data amount of the SRAM CIM-based processing unit 230 is a bits, and the SRAM CIM-based processing unit 230 can scan N non-zero weight groups $A_1$ in one time. Each of the partitions P need to be scan in c times, and each of the non-zero weight group $A_1$ includes γ weight values W1-$W_γ$.

The input data access memory 210 is configured to access the input feature data group IFM. In detail, the input data access memory 210 can be a SRAM.

The sparsity processing module 220 is signally connected to the input data access memory 210, and includes an index access memory 222 and an address computing unit 224.

The index access memory 222 is configured to access the index codes 223.

The address computing unit 224 is signally connected to the index access memory 222, the address computing unit 224 computes an input data address 215 of the input feature data group IFM corresponding to the non-zero weight groups $A_1$ according to the index codes 223. The index codes 223 corresponding to the non-zero weight groups $A_1$ of one of the kernels K1-K16 are the same as the index codes 223 corresponding to the non-zero weight groups $A_1$ of another one of the kernels K1-K16, respectively.

The SRAM CIM-based processing unit 230 is signally connected to the input data access memory 210, the SRAM CIM-based processing unit 230 receives the non-zero weight group $A_1$ and the input feature data group IFM to execute an inner product and generates the output feature data group output 1-output 16.

Furthermore, the hardware/software co-compressed computing system 200 for the SRAM CIM-based processing unit 230 further includes a controller 240. The controller 240 is signally connected to the input data access memory 210, the address computing unit 224 and the SRAM CIM-based processing unit 230. The controller 240 acquires the index condes 223 of the non-zero weight groups $A_1$ which are stored in the index access memory 222 and the input data address 215 of the input feature data group IFM corresponding to the index codes 223 via the sparsity processing module 220. The controller 240 extracts a part PIFM of the input feature data group IFM corresponding to the index codes 223 of the non-zero weight groups $A_1$ from the input data access memory 210 in batches, and executes the inner product to the part PIFM of the input feature data group IFM and the non-zero weight groups $A_1$ in the SRAM CIM-based processing unit 230.

In the embodiment of FIG. 8, the hardware/software co-compressed computing system 200 for the SRAM CIM-based processing unit 230 includes two SRAM CIM-based processing unit 230, each of the SRAM CIM-based processing unit 230 includes 8 partitions P, and each of the partitions P includes 16×4 non-zero weight groups $A_1$. A non-zero weight group $A_1$ is 4 bits, the input data amount of the SRAM CIM-based processing unit 230 is 16×4 bits, the output data amount of the SRAM CIM-based processing unit 230 is 8×16 bits, and the SRAM CIM-based processing unit 230 can scan 8 non-zero weight groups $A_1$ in one time. Each of the partitions P need to be scan in 4 times, and each of the non-zero weight group $A_1$ includes 16 weight values W1-W16. The two SRAM CIM-based processing unit 230 share the input control signal of the controller 240. Therefore, the input data amount of the two SRAM CIM-based processing unit 230 is 32×4 bits, the output data amount (i.e., output feature data group output 1, output 2, output 3-output 8, output 9-output 16 (not shown in figures)) of the two SRAM CIM-based processing unit 230 is 16×16 bits. The input control signal of the controller 240 can control two SRAM CIM-based processing units 230 computing in a same time, that is, an index code 223 can control the group of set GoS of all the partitions P in different SRAM CIM-based processing units 230.

Thus, the SRAM CIM-based processing units 230 of the hardware/software co-compressed computing system 200 of the present disclosure for the SRAM CIM-based processing unit 230 share the input control signal to control the non-zero weight groups $A_1$ sharing the same index code 223 of different kernels K1-K16.

In other embodiments, the number, the partition amount, the input amount, the output amount, the weight group scanning amount per time and the weight value amount of each of the weight groups and the capacity of the partition are depended on the actual capacity of the SRAM CIM-based processing unit, and the present disclosure is not limited thereto.

According to the aforementioned embodiments and examples, the advantages of the present disclosure are disclosed as follows.

1. The hardware/software co-compressed computing method for the SRAM CIM-based processing unit of the present disclosure only computes a part of input feature data group which is corresponding to the non-zero weight groups, to solve the problem of the limitation of the single computing amount of the SRAM CIM-based processing unit, thereby reducing the energy loss and increasing the computing speed.

2. The hardware/software co-compressed computing method for the SRAM CIM-based processing unit of the present disclosure filters the input feature data group for skipping over the non-essential computing data, to solve the problem of the insufficient space of the SRAM CIM-based processing unit and increase the meaningful computing amount in a single time.

3. The SRAM CIM-based processing unit of the hardware/software co-compressed computing system of the present disclosure shares the input control signal to control the non-zero weight groups sharing the same index code of different kernels.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A hardware/software co-compressed computing method for a static random access memory (SRAM) computing-in-memory-based (CIM-based) processing unit, which is configured to compute an input feature data group to generate an output feature data group, the hardware/software co-compressed computing method for the SRAM CIM-based processing unit comprising:

performing a data dividing step to drive a processing unit to divide a plurality of kernels corresponding to the input feature data group into a plurality of weight groups;

performing a sparsity step comprising:
performing a weight setting step to drive the processing unit to set each of the weight groups to one of a zero weight group and a non-zero weight group according to a sparsity aware computing method;

performing an address assigning step to drive a computing device to assign a plurality of index codes to a plurality of the non-zero weight groups of the kernels, respectively, and transmit the non-zero weight groups to the SRAM CIM-based processing unit; and performing a hardware decoding and calculating step to drive the SRAM CIM-based processing unit to execute an inner product to the non-zero weight groups and the input feature data group corresponding to the non-zero weight groups to generate the output feature data group;

wherein the index codes corresponding to the non-zero weight groups of one of the kernels are the same as the index codes corresponding to the non-zero weight groups of another one of the kernels, respectively.

2. The hardware/software co-compressed computing method for the SRAM CIM-based processing unit of claim 1, wherein the sparsity aware computing method comprises a regularization term, and the regularization term is configured to restrict a plurality of weight values of the weight groups.

3. The hardware/software co-compressed computing method for the SRAM CIM-based processing unit of claim 2, wherein the weight setting step comprises:
in response to determining that a sum of the weight values of one of the weight groups is greater than a self-defined value, the one of the weight groups is set to the non-zero weight group; and
in response to determining that the sum of the weight values of the one of the weight groups is smaller than or equal to the self-defined value, the one of the weight groups is set to the zero weight group.

4. The hardware/software co-compressed computing method for the SRAM CIM-based processing unit of claim 2, wherein the sparsity step further comprises:
performing a shape-wise regularization step to execute a regularization computation process to the kernels according to an area information of the weight groups, and adjust a group sequence number corresponding to the non-zero weight group to be the same as the group sequence number corresponding to the non-zero weight group of the one of the kernels;
wherein the area information comprises a kernel width, a kernel height, a channel depth, a kernel number, an input data amount and an output data amount.

5. The hardware/software co-compressed computing method for the SRAM CIM-based processing unit of claim 1, wherein each of the index codes comprises a first group index, a non-zero weight group number, a kernel plane index and a kernel depth index.

6. A hardware/software co-compressed computing system for a static random access memory (SRAM) computing-in-memory-based (CIM-based) processing unit, which is configured to compute an input feature data group to generate an output feature data group, the hardware/software co-compressed computing system for the SRAM CIM-based processing unit comprising:
a processing unit configured to divide a plurality of kernels corresponding to the input feature data group into a plurality of weight groups, set each of the weight groups to one of a zero weight group and a non-zero weight group according to a sparsity aware computing method, and assign a plurality of index codes to a plurality of the non-zero weight groups of the kernels; and
a computing device electrically connected to the processing unit, wherein the computing unit receives the input feature data group, the non-zero weight groups and the index codes corresponding to the non-zero weight groups, and the computing device comprising:
an input data access memory configured to access the input feature data group;
a sparsity processing module signally connected to the input data access memory, and comprising:
an index access memory configured to access the index codes; and
an address computing unit signally connected to the index access memory, wherein the address computing unit computes an input data address of the input feature data group corresponding to the non-zero weight groups according to the index codes; and
the SRAM CIM-based processing unit signally connected to the input data access memory, wherein the SRAM CIM-based processing unit receives the non-zero weight group and the input feature data group to execute an inner product and generates the output feature data group;
wherein the index codes corresponding to the non-zero weight groups of one of the kernels are the same as the index codes corresponding to the non-zero weight groups of another one of the kernels, respectively.

7. The hardware/software co-compressed computing system for the SRAM CIM-based processing unit of claim 6, wherein the sparsity aware computing method comprises a regularization term, and the regularization term is configured to restrict a plurality of weight values of the weight groups.

8. The hardware/software co-compressed computing system for the SRAM CIM-based processing unit of claim 7, wherein the sparsity aware computing method further comprises:
in response to determining that a sum of the weight values of one of the weight groups is greater than a self-defined value, the one of the weight groups is set to the non-zero weight group; and
in response to determining that the sum of the weight values of the one of the weight groups is smaller than or equal to the self-defined value, the one of the weight groups is set to the zero weight group.

9. The hardware/software co-compressed computing system for the SRAM CIM-based processing unit of claim 7, wherein the processing unit further comprises:
performing a shape-wise regularization step to execute a regularization computation process to the kernels according to an area information of the weight groups, and adjust a group sequence number corresponding to the non-zero weight group to be the same as the group sequence number corresponding to the non-zero weight group of the one of the kernels;
wherein the area information comprises a kernel width, a kernel height, a channel depth, a kernel number, an input data amount and an output data amount.

10. The hardware/software co-compressed computing system for the SRAM CIM-based processing unit of claim 6, wherein each of the index codes comprises a first group index, a non-zero weight group number, a kernel plane index and a kernel depth index.

* * * * *